United States Patent
Kong et al.

(10) Patent No.: US 12,202,696 B2
(45) Date of Patent: Jan. 21, 2025

(54) APPARATUS OF SUPPORTING DEBONDING AND METHOD FOR DEBONDING USING THE SAME

(71) Applicant: CORNING INCORPORATED, Corning, NY (US)

(72) Inventors: Bokyung Kong, Hwaseong-si (KR); Kyungwook Park, Seoul (KR)

(73) Assignee: CORNING INCORPORATED, Corning, NY (US)

( * ) Notice: Subject to any disclaimer, the term of this patent is extended or adjusted under 35 U.S.C. 154(b) by 1110 days.

(21) Appl. No.: 16/981,869

(22) PCT Filed: Mar. 20, 2019

(86) PCT No.: PCT/KR2019/003213
§ 371 (c)(1),
(2) Date: Apr. 27, 2021

(87) PCT Pub. No.: WO2019/182338
PCT Pub. Date: Sep. 26, 2019

(65) Prior Publication Data
US 2021/0238002 A1    Aug. 5, 2021

(30) Foreign Application Priority Data
Mar. 20, 2018   (KR) .................. 10-2018-0032006

(51) Int. Cl.
*B65H 41/00*    (2006.01)
*B29C 63/00*    (2006.01)

(52) U.S. Cl.
CPC ......... *B65H 41/00* (2013.01); *B29C 63/0013* (2013.01); *B65H 2301/51122* (2013.01);
(Continued)

(58) Field of Classification Search
CPC .......... B65H 41/00; B65H 2301/51122; B65H 2406/351; B65H 2406/3622;
(Continued)

(56) References Cited

U.S. PATENT DOCUMENTS

| | | | |
|---|---|---|---|
| 8,701,734 B2* | 4/2014 | Nakamura | .......... H01L 21/6838 156/716 |
| 2010/0248446 A1 | 9/2010 | Liu et al. | |
| 2016/0268525 A1* | 9/2016 | Bellman | .............. H10K 10/471 |

FOREIGN PATENT DOCUMENTS

| | | |
|---|---|---|
| JP | 10-226042 A | 8/1998 |
| JP | 2003-303793 A | 10/2003 |

(Continued)

OTHER PUBLICATIONS

Korean Patent Application No. 10-2018-0032006, Office Action dated Jun. 30, 2022, 7 pages (English Translation Only), Korean Patent Office.

(Continued)

*Primary Examiner* — Alex B Efta
*Assistant Examiner* — Alexander S Wright

(57) ABSTRACT

A debonding support device includes a suction plate including a support region for supporting a glass assembly, the support region including at least two suction regions applying different suction forces per unit area, the suction regions including a debonding initiation portion suction region for sucking a debonding initiation portion at which debonding of the glass assembly is to be initiated, the debonding initiation portion suction region applying the strongest of the different suction forces per unit area; a vacuum pump connected to the suction plate to provide a vacuum pressure for the suction plate, and a controller.

10 Claims, 4 Drawing Sheets

(52) U.S. Cl.
CPC ............... *B65H 2406/351* (2013.01); *B65H 2406/3622* (2013.01); *B65H 2406/3663* (2013.01); *B65H 2801/61* (2013.01)

(58) Field of Classification Search
CPC ........ B65H 2406/3663; B65H 2801/61; B29C 63/0013; B32B 43/006; H01L 21/67; H01L 21/78; H01L 21/67092
See application file for complete search history.

(56) References Cited

FOREIGN PATENT DOCUMENTS

| | | |
|---|---|---|
| JP | 2006-068592 A | 3/2006 |
| JP | 2014-228871 A | 12/2014 |
| JP | 2015-133190 A | 7/2015 |
| JP | 2016-197623 A | 11/2016 |
| KR | 10-2014-0029843 A | 3/2014 |
| KR | 10-2014-0138452 A | 12/2014 |
| KR | 10-2017-0034674 A | 3/2017 |
| KR | 10-2017-0065306 A | 6/2017 |
| KR | 10-2017-0103056 A | 9/2017 |
| KR | 10-2017-0138338 A | 12/2017 |

OTHER PUBLICATIONS

International Search Report and Written Opinion of the International Searching Authority; PCT/KR2019/003213; Mailed Jul. 18, 2019; 15 Pages; (6 Pages of English Translation and 9 Pages of Original Document) Korean Intellectual Property Office.

* cited by examiner

APPARATUS OF SUPPORTING DEBONDING AND METHOD FOR DEBONDING USING THE SAME

This application claims the benefit of priority under 35 U.S.C. § 365 of International Patent Application No. PCT/KR2019/003213 filed on Mar. 20, 2019, designating the United States of America, which in turn claims the benefit of priority under 35 U.S.C. § 119 of Korean Patent Application Serial No. KR 10-2018-0032006 filed Mar. 20, 2018, the content of each of which is relied upon and incorporated herein by reference in its entirety.

TECHNICAL FIELD

The present invention relates to a debonding support device and a debonding method using the same and, more specifically, to a debonding support device and a debonding method using the same capable of reducing a probability of damage occurrence of a sheet of ultrathin glass during a debonding process.

BACKGROUND ART

In electronic device fields including a display panel, a touch sensor, a photoelectric cell panel and a lighting device, needs for a lighter and thinner flexible device are increasing. In response to the needs, an ultrathin substrate, particularly, an ultrathin glass substrate is attracting much attention because it has better hermeticity, light transmittance, surface roughness and heat and chemical stability than a polymer substrate. However, it is difficult to apply the ultrathin glass substrate to an existing manufacturing line for a rigid glass substrate due to sagging and damage during handling. For easy handling and process of the ultrathin glass, a sheet of ultrathin glass bonded to a carrier has been suggested, and extensive efforts on temporary glass-glass bonding technology have been made. In the glass bonding technology including surface modification of the carrier for temporary bonding, a carrier design for easy debonding and a bonding/debonding method, the stable bonding of the sheet of ultrathin glass to the carrier and a device for debonding the sheet of ultrathin glass from the carrier are core factors of determining a process yield.

Regarding a number of processes of using the sheet of thin glass on a carrier substrate, a process of debonding the sheet of thin glass from the carrier is a core factor of determining the process yield. In order to successfully debond the sheet of thin glass from the carrier, three issues of appropriate debonding initiation, separation of the sheet of thin glass from the carrier without a damage and prevention of defect formation in a device during the debonding process should be solved.

The debonding initiation is a core process for the debonding process, and a variety of developments such as design changes of the carrier, for example, a notch, a hold, and a step height or roughness difference have been made. Also, sonication and a method of inserting a blade between the sheet of thin glass and the carrier have been developed. However, the method of changing the carrier design requires an addition process for preparing a carrier with a special design that is more expensive, and the sonication or blade insertion method has a high possibility that the sheet of thin glass will be damaged during the debonding initiation process. Therefore, it is required to develop a debonding initiation method in which an additional process is not required and there is no concern over the damage of the sheet of thin glass.

Since the sheet of thin glass having sagging and bending characteristics has a small thickness, the sheet of thin glass may be a little bent during the separation of the carrier and the sheet of thin glass. Due to the bending, the sheet of thin glass is likely to be broken during the debonding process. In particular, such damage can be easily caused when the sheet of thin glass having small defect sites is bent during the debonding process. Therefore, in order to achieve the high debonding yield, it is important to develop a debonding method capable of minimizing the bending of the sheet of thin glass during the debonding process.

It is also important to protect a panel formed on the sheet of thin glass because some contact and force may be applied to the panel during the debonding process. Therefore, the appropriate handling method and configuration of the debonding device are also important factors to be considered when developing the debonding method and tool.

SUMMARY OF INVENTION

Technical Problem

The present invention has been made in view of the above situations, and an object thereof is to provide a debonding support device and a debonding method using the same capable of reducing a probability of damage occurrence of a sheet of ultrathin glass during a debonding process.

Solution to Problem

In order to achieve the above object, according to the present invention, there is provided a debonding support device for supporting a process of debonding a sheet of carrier glass and a sheet of ultrathin glass bonded to each other to form a single glass assembly. The debonding support device includes a suction plate including a support region for supporting the glass assembly, the support region including at least two suction regions applying different suction forces per unit area, the at least two suction regions including a debonding initiation portion suction region for sucking a debonding initiation portion of the glass assembly at which debonding of the glass assembly is to be initiated, the debonding initiation portion suction region applying the strongest of the different suction forces per unit area; a vacuum pump connected to the suction plate to provide a vacuum pressure for the suction plate, and a controller configured to control the vacuum pump to adjust the vacuum pressure.

In an embodiment, the debonding initiation portion suction region may be positioned at a corner of the support region and may have a plurality of first suction holes connected to the vacuum pump.

In an embodiment, the at least two suction regions may include side portion suction regions positioned at sides of the support region, and the side portion suction regions may have a plurality of second suction holes connected to the vacuum pump.

In an embodiment, the side portion suction regions may be positioned at three sides of four sides of the support region, except a side most distant from the debonding initiation portion suction region.

In an embodiment, the at least two suction regions may include a central portion suction region positioned at a center of the support region, and the central portion suction region may have a plurality of third suction holes connected to the vacuum pump.

In an embodiment, the debonding initiation portion suction region may have a smaller area than the central portion suction region, and the plurality of first suction holes may be distributed more densely than the plurality of third suction holes.

In an embodiment, each of the first, second and third suction holes may have a pressure-reducing portion provided in an end thereof which faces the glass assembly, and having a relatively greater hole area.

In an embodiment, the debonding support device may further include at least one suction cap disposed facing the support region.

In an embodiment, the suction cap may be connected to the vacuum pump to suck the glass assembly with a vacuum pressure provided by the vacuum pump.

In an embodiment, the suction cap may be configured to be movable upwardly and downwardly.

Also, according to the present invention, there is provided a debonding method including: aligning a glass assembly, which comprises a sheet of ultrathin glass and a sheet of carrier glass bonded to each other, on a support region of a suction plate of the debonding support device such that the sheet of ultrathin glass faces the support region; providing a vacuum pressure to the suction plate to support and suck the glass assembly; initiating debonding by advancing a debonding starter into a space between the suction plate and the sheet of carrier glass, and debonding the sheet of carrier glass from the sheet of ultrathin glass over the entire support region.

In an embodiment, the debonding may include: lifting upwardly the debonding starter which has advanced into the space between the suction plate and the sheet of carrier glass in the initiating, and completely separating, from the sheet of ultrathin glass, the sheet of carrier glass by lifting upwardly an upper surface opposite a lower surface of the sheet of carrier glass in contact with the debonding starter.

In an embodiment, in the initiating, the debonding starter may be advanced into the space between the suction plate and the sheet of carrier glass in a lateral direction, and in the debonding, the debonding starter may be lifted in an upward direction at an angle to the lateral direction.

In an embodiment, in the initiating, the debonding starter may be advanced as far as the debonding starter is in non-contact with the sheet of ultrathin glass.

In an embodiment, the sheet of carrier glass has a greater area than the sheet of ultrathin glass to encompass the sheet of ultrathin glass, the sheet of ultrathin glass may be provided with a plurality of device layers formed thereon, and when the glass assembly is supported on the support region, the sheet of ultrathin glass and the plurality of device layers may come in contact with the support region.

In an embodiment, the debonding starter may include a metal bar.

In an embodiment, the debonding starter may be thicker than the sheet of ultrathin glass.

Advantageous Effects of Intention

According to the present invention, during the initiating and the debonding, only the suction plate comes in contact with the sheet of ultrathin glass, and the strong suction force is generated to perfectly tack an edge of the sheet of ultrathin glass. Therefore, during the initiating and the debonding, it is possible to reduce the bending of the sheet of ultrathin glass or a probability of damage occurrence due to the bending, so that it is possible to improve the process yield.

Also, according to the present invention, intervals of the suction holes are adjusted so that the relatively weaker suction force is applied to a portion of the sheet of ultrathin glass on which the plurality of device layers are provided. Therefore, it is possible to prevent defects from being created in the device layers due to the suction force applied to the device layers during the debonding.

DESCRIPTION OF EMBODIMENTS

Figure 1:
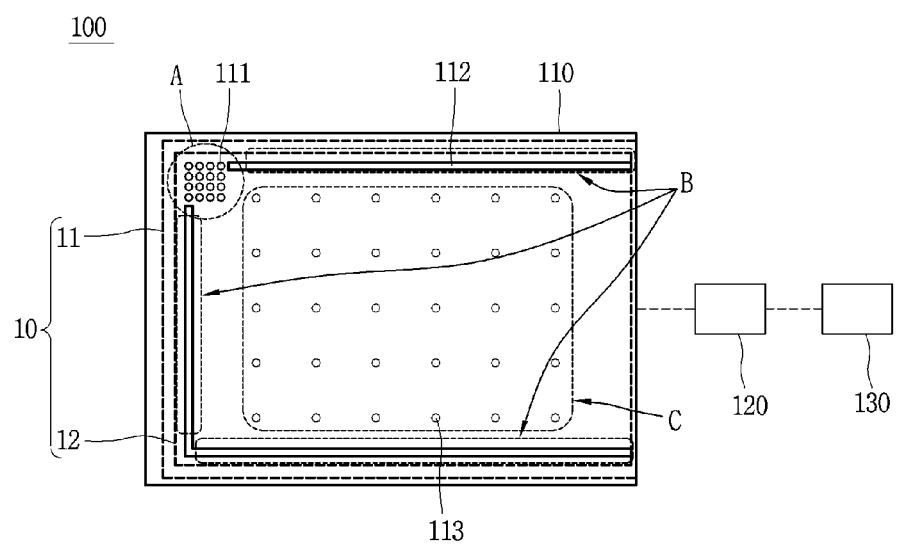
FIG. 1 is a view depicting a suction plate of a debonding support device in accordance with an embodiment of the present invention.

Hereinafter, a debonding support device and a debonding method using the same in accordance with an embodiment of the present invention will be described in detail with reference to the accompanying drawings.

When describing the present invention, the specific descriptions of the related well-known functions or configurations will be omitted if it is considered that the descriptions make the gist of the present invention unclear.

It should be understood that the terms relating to directions such as an upper surface, an upper side, a vertical direction, a horizontal direction and the like mentioned in the specification are used not to indicate absolute directions but to indicate relative directions. For example, it should be understood that the vertical direction is used not to mean a direction perpendicular to the surface of the earth but to simply indicate a direction perpendicular to a direction referred to as the horizontal direction.

As shown in FIGS. 1 to 4, a debonding support device 100 in accordance with an embodiment of the present invention is a device for supporting a process of debonding a sheet of carrier glass 11 and a sheet of ultrathin glass 12 bonded to each other to form a single glass assembly 10 by using a debonding starter 20.

To this end, the debonding support device 100 in accordance with the embodiment of the present invention includes a suction plate 110, a vacuum pump 120 and a controller 130.

The suction plate 110 is configured to suck and support the glass assembly 10 placed on an upper surface thereof. Here, the glass assembly 10 is provided so as to support the sheet of ultrathin glass 12 since it is difficult to handle when carrying the sheet of ultrathin glass 12 or forming device layers 13 on the sheet of ultrathin glass 12, and is formed by bonding the sheet of ultrathin glass 12 on the sheet of carrier glass 11. That is, the glass assembly 10 is provided so as to stably perform a process of forming the device layers 13 in a state where the sheet of ultrathin glass 12 is supported by the sheet of carrier glass 11.

Figure 2:
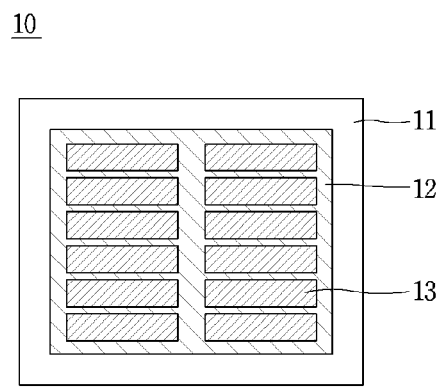
FIGS. 2 and 3 are views depicting a glass assembly formed by a sheet of carrier glass and a sheet of ultrathin glass bonded to each other.
Figure 3:
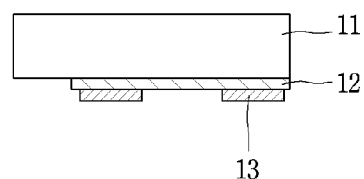

The glass assembly 10 is formed by bonding the sheet of carrier glass 11 and the sheet of ultrathin glass 12 having different thicknesses and areas. As shown in FIG. 2, the sheet of carrier glass 11 having a greater area and a greater thickness is bonded to the sheet of ultrathin glass 12 in such a manner that the sheet of carrier glass 11 encompasses the sheet of ultrathin glass, i.e., the sheet of carrier glass 11 protrudes outward from four sides of the sheet of ultrathin glass 12, so that the single glass assembly 10 is formed. In this state, for example, indium tin oxide (ITO) to form an electrode layer is formed and patterned on the sheet of ultrathin glass 12, an insulating layer is formed and patterned thereon, and an organic light-emitting layer is vapor deposited on each of the patterned insulating layers and is then encapsulated by an encapsulation film, so that the plurality of device layers 13 is formed. When the formation of the plurality of device layers 13 is completed, the sheet of ultrathin glass 12 provided with the plurality of device layers 13 formed thereon should be debonded from the sheet of carrier glass 11 so as to proceed to a subsequent process such as panel cutting.

In the embodiment of the present invention, the sheet of ultrathin glass 12 means a sheet of glass having a thickness of about 50 μm to 300 μm. Also, as described above, as the sheet of carrier glass 11, a sheet of glass thicker than the sheet of ultrathin glass 12 is used.

For the debonding process, the glass assembly 10 is placed on the suction plate 110. At this time, an upper surface of the suction plate 110 faces the sheet of ultrathin glass 12 and the plurality of device layers 13 and finally comes in contact with the same.

In an embodiment, the suction plate 110 includes a support region. In an embodiment, the support region may be formed to have an area corresponding to the sheet of ultrathin glass 12 and the device layer 13. In an embodiment, the support region has a quadrangular shape. However, the present invention is not limited thereto. In an embodiment, the support region may include at least two suction regions in which different suction forces per unit area are to be applied. In this case, the strongest suction force per unit area can be applied in a debonding initiation portion suction region (first region A), which is provided so as to suck a portion at which debonding of the glass assembly is to be initiated by the debonding starter 20, of the at least two suction regions. In an embodiment, the at least two suction regions may include side portion suction regions (second region B) and a central portion suction region (third region C).

In an embodiment, the first region A may have a plurality of first suction holes 111. In an embodiment, the second region B may have a plurality of second suction holes 112. In an embodiment, the third region C may have a plurality of third suction holes 113. The first region A, the second region B and the third region C may face the sheet of ultrathin glass 12 in a vertical direction, and are in contact with the sheet of ultrathin glass 12. That is, the sheet of ultrathin glass 12 may cover the first region A, the second region B and the third region C so that the first to third regions do not directly face (a lower surface of) the sheet of carrier glass 11.

The plurality of first suction holes 111 forming the first region A sucks the sheet of ultrathin glass 12 to enable the debonding initiation when the debonding is initiated, and is formed to correspond to a debonding initiation portion of a corner of a lower surface of the sheet of ultrathin glass 12 of the glass assembly 10 in place. That is, the plurality of first suction holes 111 is formed to suck and support a corner, which is a portion at which the debonding is to be initiated, of the lower surface of the sheet of ultrathin glass 12. In order to enable the debonding initiation and to prevent the sheet of ultrathin glass 12 from being damaged during the debonding process, when the glass assembly 10 is placed, the portion at which the debonding is to be initiated should be aligned to correspond to the plurality of first suction holes 111.

The plurality of first suction holes 111 is connected to the vacuum pump 120 so as to suck and fix the sheet of ultrathin glass 12 when the debonding starter 20 is advanced up to a position between the suction plate 110 and the sheet of carrier glass 11 behind the first region A with respect to a direction in which the debonding progresses. In the embodiment of the present invention, the debonding starter 20 may be configured by a thin metal bar. The debonding starter 20 is preferably formed thicker than the sheet of ultrathin glass 12 so that the debonding can be initiated by the advancing operation in the lateral direction.

In the embodiment of the present invention, for the initiation of the debonding, the debonding starter 20 is advanced only up to a position behind the first region A in the direction that the debonding progresses. Even though the debonding starter is advanced only up to the position, the debonding can be initiated because the debonding starter 20 is thicker than the sheet of ultrathin glass 12, as described above. That is, in the embodiment of the present invention, the debonding starter 20 is not advanced into the first region A formed by the plurality of first suction holes 111 for sucking and supporting the corner of the lower surface of the sheet of ultrathin glass 12. Therefore, the debonding initiation and the main debonding are performed in a state where there is no contact between the debonding starter 20 and the sheet of ultrathin glass 12. During the debonding initiation and the main debonding, the debonding starter 20 come in contact with only the suction plate 110 and the sheet of carrier glass 11. As a result, it is possible to prevent the sheet of ultrathin glass 12 from being damaged by the debonding starter 20 during the debonding process.

As shown in FIG. 1, the plurality of first suction holes 111 forming the first region A is distributed more densely than the plurality of third suction holes 113 forming the third region C. Also, the first region A formed by the plurality of first suction holes 111 has a smaller area than the third region C formed by the plurality of third suction holes 113. Therefore, the relatively stronger suction force per unit area is generated in the first region A formed by the plurality of first suction holes 111. Therefore, when the debonding is initiated, the corner of the sheet of ultrathin glass 12 sucked to the first region A are perfectly tacked. As a result, it is possible to reduce a probability of damage occurrence of the sheet of ultrathin glass 12 during the debonding process, and to improve the process yield.

In the embodiment of the present invention, the plurality of first suction holes 111 are distributed in a lattice form. However, this is just exemplary. For example, the plurality of first suction holes 111 may be distributed in diverse intervals and diverse forms capable of inducing the strong suction force. That is, in the present invention, the arrangement form of the plurality of first suction holes 111 is not limited to the lattice form or specific intervals.

In the meantime, each of the plurality of first suction holes 111 has a pressure-reducing portion 115 that is formed in an end portion thereof facing the glass assembly 10, i.e., in a surface of the suction plate 110 and has a relatively greater hole area (when the area is measured in the horizontal plane). The pressure-reducing portion 115 functions to prevent a shape of the first suction hole 111 from being transferred to a surface of the sheet of ultrathin glass 12 in the process of sucking and supporting the sheet of ultrathin glass 12. Also, the pressure-reducing portion 115 serves to prevent the sheet of ultrathin glass 12 from being locally damaged, which may be caused as the high vacuum pressure is applied to the surface of the sheet of ultrathin glass 12 in contact with the plurality of first suction holes 111, each of which is formed in a small size.

The plurality of second suction holes 112 forming the second region B is formed at positions corresponding to edges of the lower surface of the sheet of ultrathin glass 12 of the glass assembly 10 placed in position. The plurality of second suction holes 112 is formed to suck and support the edges of the sheet of ultrathin glass 12 so as to prevent the sheet of ultrathin glass 12 from being damaged and the edges of the sheet of ultrathin glass 12 from being bent in a lifting direction of the sheet of carrier glass 11 during the main debonding after the debonding initiation.

The plurality of second suction holes 112 is connected to the vacuum pump 120 so as to suck and fix the edges of the sheet of ultrathin glass 12 when the sheet of carrier glass 11 is lifted by the debonding starter 20.

As shown in FIG. 1, in an embodiment, each of the plurality of second suction holes 112 forming the second region B may be a line-shaped hole corresponding to the edge of the lower surface of the sheet of ultrathin glass 12. Alternatively, a plurality of holes in one row (or a plurality of rows) may be formed, instead of the line-shaped hole. When the second suction holes 112 are formed in a line-shape along the edges of the sheet of ultrathin glass 12, it is possible to reduce a probability that the edges of the sheet of ultrathin glass 12 will be damaged or bent in the lifting direction of the sheet of carrier glass 11 during the debonding process. Since the debonding is progressed from the left toward the right when referring to the drawing, the second suction holes 112 are preferably formed at positions corresponding to the left, upper and lower edges of the lower surface of the sheet of ultrathin glass 12, except an edge of the lower surface of the sheet of ultrathin glass 12 most distant in the progressing direction of the debonding, i.e., a right edge of the lower surface of the sheet of ultrathin glass 12 on the drawing, so as to enable the smooth debonding and to prevent the bending or damage due to unnecessary suction.

In the meantime, each of the plurality of second suction holes 112 may have a pressure-reducing portion 115 that is formed in an end portion thereof facing the glass assembly 10, i.e., in a surface of the suction plate 110 and has a relatively greater hole area, like the first suction holes 111.

The plurality of third suction holes 113 forming the third region C is formed in a region corresponding to a portion of the sheet of ultrathin glass 12 of the placed glass assembly 10 on which the plurality of device layers 13 are provided. The plurality of third suction holes 113 is formed to suck and support the portion during the main debonding after the debonding initiation.

The plurality of third suction holes 113 is connected to the vacuum pump 120 so as to suck and fix the plurality of device layers 13 when the sheet of carrier glass 11 is lifted by the debonding starter 20.

As shown in FIG. 1, the plurality of third suction holes 113 forming the third region C is formed with wider intervals than the plurality of first suction holes 111 forming the first region A. Also, the third region C formed by the plurality of third suction holes 113 has a greater area than the first region A formed by the plurality of first suction holes 111. Therefore, a relatively weaker suction force per unit area can be generated in the third region C formed by the plurality of third suction holes 113. Thereby, during the main debonding after the debonding initiation, the portion on which the plurality of device layers 13 are provided is sucked to the third region C with the relatively weaker suction force per unit area. As a result, it is possible to prevent the device layers 13 from being damaged by the suction force applied during the debonding process.

In the embodiment of the present invention, the plurality of third suction holes 113 may be arranged in a lattice shape. However, this is just exemplary. For example, the plurality of third suction holes 113 may be distributed in diverse intervals and diverse forms capable of generating the relatively weaker suction force. That is, in the present invention, the arrangement form of the plurality of third suction holes 113 is not limited to the lattice form or specific intervals.

In the meantime, each of the plurality of third suction holes 113 may have a pressure-reducing portion 115 that is formed in an end portion thereof facing the glass assembly 10, i.e., in a surface of the suction plate 110 and has a relatively greater hole area, like the plurality of first suction holes 111 and the plurality of second suction holes 112.

The vacuum pump 120 is connected to the suction plate 110, more specifically, to the plurality of first suction holes 111, the plurality of second suction holes 112 and the plurality of third suction holes 113 and is configured to provide a vacuum pressure for each hole. In this way, the suction forces are generated in the plurality of first suction holes 111, the plurality of second suction holes 112 and the plurality of third suction holes 113 by the vacuum pressure provided by the vacuum pump 120.

The controller 130 is configured to control the vacuum pump 120 to adjust the vacuum pressure that is to be provided for the plurality of first suction holes 111, the plurality of second suction holes 112 and the plurality of third suction holes 113.

Figure 7:
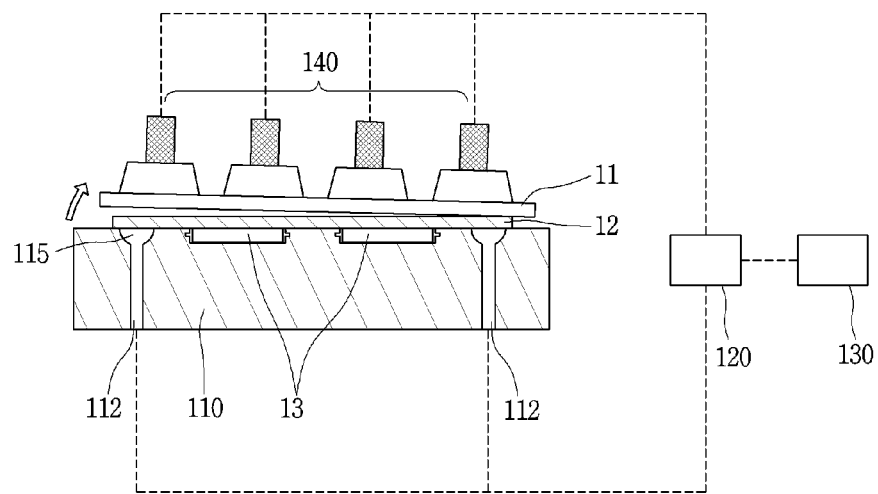
FIG. 7 is a pictorial view depicting an aspect where the debonding support device is provided with suction caps in accordance with an embodiment of the present invention.

In the meantime, as shown in FIG. 7, the debonding support device 100 in accordance with the embodiment of the present invention may further include at least one suction cap 140. The suction cap 140 is arranged over the sheet of carrier glass 11 when the glass assembly 10 is placed on the upper surface of the suction plate 110. The suction cap 140 is connected to the vacuum pump 120 that is to be controlled by the controller 130, and is configured to suck upward the sheet of carrier glass 11 by the vacuum pressure that is provided by the vacuum pump 120.

In the embodiment of the present invention, the suction cap 140 is configured to be movable upwardly and downwardly. The movement of the suction cap 140 can be controlled by the controller 130. Also, when the sheet of carrier glass 11 is lifted by the debonding starter 20, the suction cap 140 lifts upward the sucked sheet of carrier glass 11 under control of the controller 130, thereby completely separating the sheet of carrier glass 11 from the sheet of ultrathin glass 12.

That is, in the embodiment of the present invention, the glass assembly 10 formed by the sheet of carrier glass 11 and the sheet of ultrathin glass 12 bonded to each other is debonded by the debonding starter 20 and the suction cap 140.

In the below, the process of debonding the glass assembly by using the debonding support device in accordance with the embodiment of the present invention is described with reference to FIGS. 4 to 6. The configurations not shown in FIGS. 4 to 6 are described with reference to the other drawings.

Figure 4:
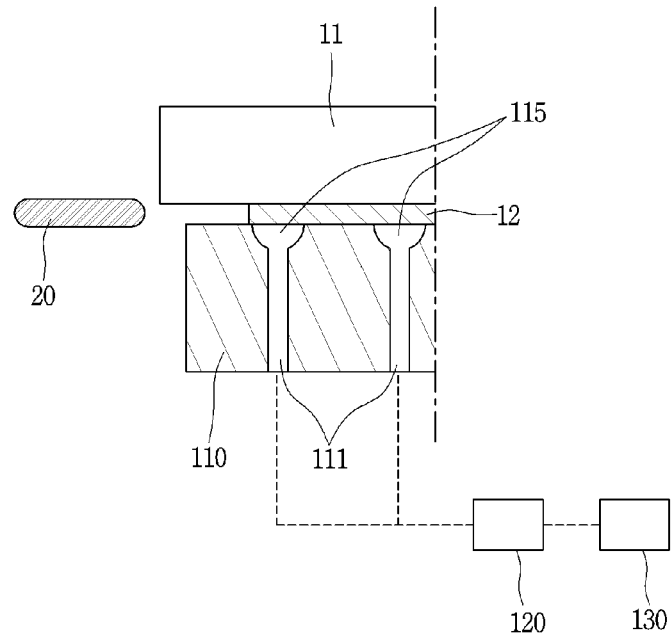
FIGS. 4 to 6 are pictorial views sequentially depicting a process of debonding the glass assembly by using the debonding support device in accordance with an embodiment of the present invention.

First, as shown in FIG. 4, the glass assembly 10 to be debonded is placed on the suction plate 110. At this time, the glass assembly 10 is placed on the suction plate 110 so that the sheet of ultrathin glass 12 faces downward. Also, the glass assembly 10 is aligned so that the corner of the sheet of ultrathin glass 12, at which the debonding is to be initiated, is positioned on the first region A formed by the plurality of first suction holes 111. At this time, edges of the sheet of ultrathin glass 12 are positioned on the second region B formed by the plurality of second suction holes 112, and the portion of the sheet of ultrathin glass 12 on which the plurality of device layers 13 are provided is positioned on the third region C formed by the plurality of third suction holes 113.

When the glass assembly 10 is aligned on the upper surface of the suction plate 110 in this way, the controller 130 controls the vacuum pump 120 to provide the vacuum pressure for the first region A formed by the plurality of first suction holes 111, the second region B formed by the plurality of second suction holes 112 and the third region C formed by the plurality of third suction holes 113. Thereby, the glass assembly 10 is sucked and supported on the upper surface of the suction plate 110. At this time, the plurality of first suction holes 111, the plurality of second suction holes 112 and the plurality of third suction holes 113 have different arrangement structures and forms. Thus, the relatively stronger suction force per unit area is generated in the first region A formed by the plurality of first suction holes 111 for sucking the debonding initiation portion, as compared to the other regions B, C, and the relatively weaker suction force per unit area is generated in the third region C formed by the plurality of third suction holes 113 for sucking the portion on which the plurality of device layers 13 are provided, as compared to the other regions A, B.

Figure 5:
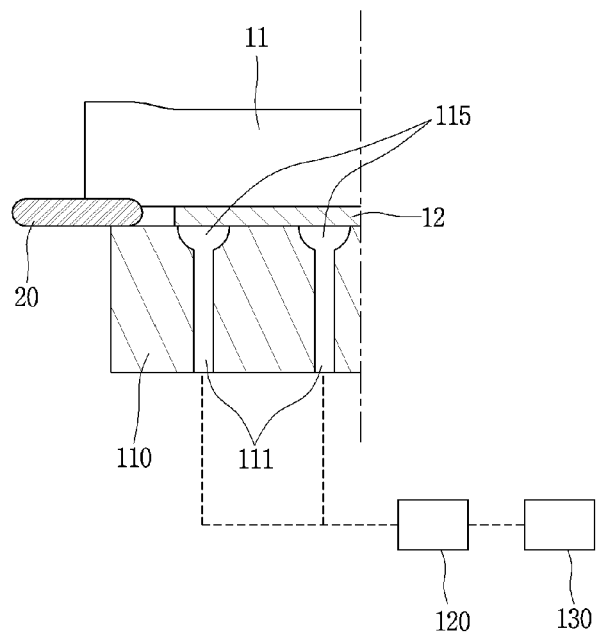
Figure 6:
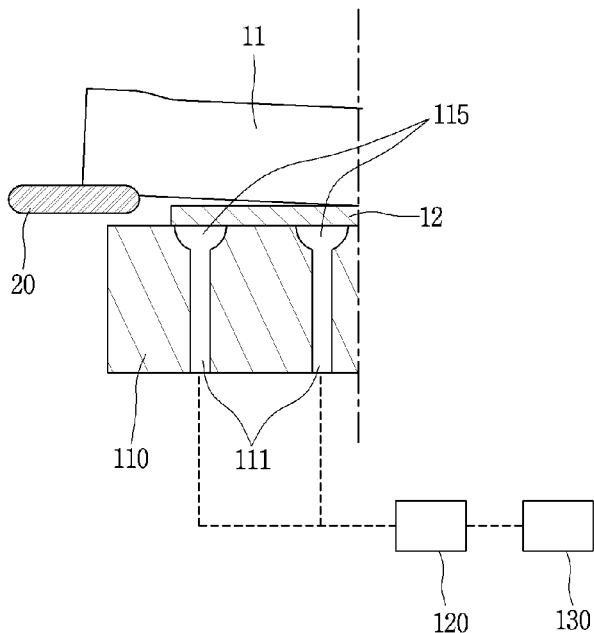

Subsequently, as shown in FIG. 5, when the debonding starter 20 is advanced into a space between the suction plate 110 and the sheet of carrier glass 11, the debonding is initiated. That is, when the debonding starter 20 thicker than the sheet of ultrathin glass 12 is advanced into the space between the suction plate 110 and the sheet of carrier glass 11, the sheet of carrier glass 11 is pushed and lifted upward by the debonding starter 20 being advanced. At this time, the debonding initiation portion of the sheet of ultrathin glass 12 remains sucked and fixed by the stronger suction force applied by the plurality of first suction holes 111. A bonding force between the first region A formed by the plurality of first suction holes 111 and one surface of the sheet of ultrathin glass 12 in contact with the first region is stronger than a bonding force between the sheet of carrier glass 11 and the other surface of the sheet of ultrathin glass 12 bonded thereto. Therefore, even when the sheet of carrier glass 11 is lifted by the debonding starter 20, the one surface of the sheet of ultrathin glass 12 remains fixed and the sheet of carrier glass 11 is debonded from the other surface of the sheet of ultrathin glass 12. At this time, the debonding starter 20 is advanced as far as it remains in non-contact with the sheet of ultrathin glass 12 in the advancing direction. This is because the debonding is already initiated before the debonding starter 20 comes in contact with the sheet of ultrathin glass 12. That is, there is no reason that the debonding starter 20 should be further advanced. Therefore, it is possible to prevent the sheet of ultrathin glass 12 from being damaged by the debonding starter 20 during the debonding initiation.

Finally, as shown in FIG. 6, after the debonding starter 20 is advanced in the horizontal direction to initiate the debonding, the debonding starter 20 is lifted in an upward direction at an angle to the horizontal direction, for example, in the vertical direction, and the sheet of carrier glass 11 is debonded from the sheet of ultrathin glass 12 over an entire region. At this time, edges of the sheet of ultrathin glass 12 are stably sucked and fixed by the suction force applied by the plurality of second suction holes 112 formed along the corresponding edges. Therefore, even when the bonded sheet of carrier glass 11 is debonded, the probability that the edges of the sheet of ultrathin glass 12 will be bent or damaged is reduced. Also, the plurality of device layers 13 formed on the sheet of ultrathin glass 12 is stably sucked and fixed by the suction force applied by the plurality of third suction holes 113. In addition, it is possible to prevent defects from being generated in the device layers 13 because the relatively weaker suction force is applied by the plurality of third suction holes 113.

In the meantime, the sheet of carrier glass 11 debonded from the sheet of ultrathin glass 12 by the debonding starter 20 is completely separated from the sheet of ultrathin glass 12 by at least one suction cap 140 sucking the upper surface of the sheet of carrier glass. When the sheet of carrier glass 11 is completely separated from the sheet of ultrathin glass 12, the debonding process for the glass assembly 10 is completed. The sheet of ultrathin glass 12 debonded from the sheet of carrier glass 11 by using the debonding support device 100 in accordance with the embodiment of the present invention is thereafter cut in a process of forming the plurality of device layers 13 into individual panels.

Although the present invention has been described with reference to the specific embodiments and the drawings, the present invention is not limited to the embodiments, and a variety of variations and modifications can be made by one skilled in the art of the present invention.

Therefore, the scope of the present invention should not be defined by the above-described embodiments but should be defined by the appended claims and equivalents thereof.

REFERENCE SIGNS LIST

100: debonding support device
110: suction plate
111: first suction hole
112: second suction hole
113: third suction hole
115: pressure-reducing portion
120: vacuum pump
130: controller
140: suction cap
10: glass assembly
11: sheet of carrier glass
12: sheet of ultrathin glass
13: device layer
20: debonding starter

The invention claimed is:

1. A debonding method comprising:
aligning a glass assembly, which comprises a sheet of ultrathin glass and a sheet of carrier glass bonded to each other, on a support region of a suction plate of a debonding support device such that the sheet of ultrathin glass faces and is in direct contact with the support region;
wherein the debonding support device comprises:
the suction plate comprising the support region for supporting the glass assembly, the support region comprising at least two suction regions applying different suction forces per unit area, the at least two suction regions comprising a debonding initiation portion suction region for sucking a debonding initiation portion of the glass assembly at which debonding of the glass assembly is configured to be initiated, the debonding initiation portion suction region applying the strongest of the different suction forces per unit area;

a vacuum pump connected to the suction plate to provide a vacuum pressure for the suction plate, and a controller configured to control the vacuum pump to adjust the vacuum pressure;

providing the vacuum pressure to the suction plate to support and suck the glass assembly;

initiating debonding by advancing a debonding starter into a space between the suction plate and the sheet of carrier glass; and debonding the sheet of carrier glass from the sheet of ultrathin glass over the entire support region.

2. The debonding method according to claim 1, wherein the debonding comprises:

lifting upwardly the debonding starter which has entered the space between the suction plate and the sheet of carrier glass in the initiating, and completely separating, from the sheet of ultrathin glass, the sheet of carrier glass by lifting upwardly an upper surface opposite a lower surface of the sheet of carrier glass in contact with the debonding starter.

3. The debonding method according to claim 1, wherein in the initiating, the debonding starter is advanced into the space between the suction plate and the sheet of carrier glass in a lateral direction, and wherein in the debonding, the debonding starter is lifted in an upward direction at an angle to the lateral direction.

4. The debonding method according to claim 3, wherein in the initiating, the debonding starter is advanced as far as the debonding starter remains in non-contact with the sheet of ultrathin glass.

5. The debonding method according to claim 1, wherein the sheet of carrier glass has a greater area than the sheet of ultrathin glass to encompass the sheet of ultrathin glass, wherein the sheet of ultrathin glass is provided with a plurality of device layers formed thereon, and wherein when the glass assembly is supported on the support region, the sheet of ultrathin glass and the plurality of device layers come in contact with the support region.

6. The debonding method according to claim 1, wherein the debonding starter comprises a metal bar.

7. The debonding method according to claim 1, wherein the debonding starter is thicker than the sheet of ultrathin glass.

8. The debonding method according to claim 1, wherein the support region comprising at least three suction regions applying different suction forces per unit area.

9. A debonding method comprising:

aligning a glass assembly, which comprises a sheet of ultrathin glass and a sheet of carrier glass bonded to each other, on a support region of a suction plate of a debonding support device such that the sheet of ultrathin glass faces the support region;

wherein the debonding support device comprises:

the suction plate comprising the support region for supporting the glass assembly, the support region comprising at least three suction regions applying different suction forces per unit area, the at least three suction regions comprising a debonding initiation portion suction region for sucking a debonding initiation portion of the glass assembly at which debonding of the glass assembly is configured to be initiated, the debonding initiation portion suction region applying the strongest of the different suction forces per unit area;

a vacuum pump connected to the suction plate to provide a vacuum pressure for the suction plate, and a controller configured to control the vacuum pump to adjust the vacuum pressure;

providing the vacuum pressure to the suction plate to support and suck the glass assembly;

initiating debonding by advancing a debonding starter into a space between the suction plate and the sheet of carrier glass; and debonding the sheet of carrier glass from the sheet of ultrathin glass over the entire support region.

10. The debonding method according to claim 9, wherein the alignment of the glass assembly on the support region of the suction plate results in the sheet of ultrathin glass facing and in direct contact with the support region.

* * * * *